United States Patent
Naor et al.

(10) Patent No.: US 9,776,809 B1
(45) Date of Patent: Oct. 3, 2017

(54) CONVEYING SYSTEM WITH VACUUM WHEEL

(71) Applicant: CoreFlow Ltd., Daliyat al-Karmel (IL)

(72) Inventors: Isaac Naor, Hod-HaSharon (IL); Ronen Lautman, Haifa (IL)

(73) Assignee: Core Flow Ltd., Daliyat al-Karmel (IL)

( * ) Notice: Subject to any disclaimer, the term of this patent is extended or adjusted under 35 U.S.C. 154(b) by 0 days.

(21) Appl. No.: 15/086,068

(22) Filed: Mar. 31, 2016

(51) Int. Cl.
*B65G 53/02* (2006.01)
*B65G 47/84* (2006.01)
*B65G 51/03* (2006.01)
*H01L 21/67* (2006.01)
*H01L 21/677* (2006.01)

(52) U.S. Cl.
CPC ........... *B65G 47/848* (2013.01); *B65G 51/03* (2013.01); *H01L 21/67259* (2013.01); *H01L 21/67706* (2013.01); *H01L 21/67721* (2013.01)

(58) Field of Classification Search
CPC ................................ B65G 53/02; B65G 51/03
USPC .................... 406/70, 78, 89, 52, 192
See application file for complete search history.

(56) References Cited

U.S. PATENT DOCUMENTS

| | | | | |
|---|---|---|---|---|
| 2,207,434 A | * | 7/1940 | Haven ..................... | B65G 51/40 209/215 |
| 2,250,810 A | * | 7/1941 | Nordmeyer ............ | B65G 51/40 406/5 |
| 3,469,887 A | * | 9/1969 | Toyoda ................ | B65G 19/303 104/23.2 |
| 3,545,813 A | * | 12/1970 | Matsumoto ............ | B65G 51/03 104/138.1 |
| 3,608,973 A | * | 9/1971 | Klyee .................... | B65G 53/60 406/70 |
| 3,848,752 A | | 11/1974 | Branch et al. | |
| 3,940,243 A | * | 2/1976 | Adams ................... | B65G 51/03 406/52 |
| 4,090,645 A | * | 5/1978 | Mowbray ............... | B41F 23/06 222/414 |

(Continued)

FOREIGN PATENT DOCUMENTS

| | | |
|---|---|---|
| GB | 2390072 A | 12/2003 |
| JP | 2010116248 A | 5/2010 |
| WO | WO 2015076141 A1 | 5/2015 |

OTHER PUBLICATIONS

International Search Report of PCT Application No. PCT/IL2017/050217, dated May 28, 2017.

*Primary Examiner* — Joseph Dillon, Jr.
(74) *Attorney, Agent, or Firm* — Pearl Cohen Zedek Latzer Baratz LLP (57) ABSTRACT

A system for conveying a substrate includes a noncontact support platform for supporting the substrate. A vacuum wheel is located adjacent to the support platform. A rim of the vacuum wheel includes perforations that open between an exterior of the rim and an interior of the vacuum wheel. A fixed suction surface is interior to the vacuum wheel and includes an opening of a conduit that is connectable to a suction source. A chamber is formed by the suction surface, walls of the vacuum wheel, and a section of the peripheral rim that is adjacent to the suction surface and that extends outward from the support platform. When suction is applied to the conduit, the suction is applied via the chamber to the perforations in the rim section so as to exert a pull on the substrate toward the rim such that rotation of the vacuum wheel conveys the substrate.

17 Claims, 6 Drawing Sheets

(56) References Cited

U.S. PATENT DOCUMENTS

| | | | | |
|---|---|---|---|---|
| 4,136,911 A * | 1/1979 | Husges | ............... | D01G 23/08 |
| | | | | 19/105 |
| 4,154,370 A * | 5/1979 | Mowbray | ............... | B41F 23/06 |
| | | | | 222/414 |
| 4,781,494 A * | 11/1988 | Cedrone | ........... | H01L 21/67784 |
| | | | | 209/573 |
| 4,890,960 A * | 1/1990 | Brown | ................... | B65G 29/02 |
| | | | | 406/80 |
| 4,915,547 A * | 4/1990 | Cahill | ............... | B65G 47/8853 |
| | | | | 193/46 |
| 5,037,245 A * | 8/1991 | Smith | ............... | B65G 47/5154 |
| | | | | 406/88 |
| 5,439,207 A * | 8/1995 | Schleicher | ............ | B65G 51/03 |
| | | | | 271/193 |
| 6,419,217 B1 * | 7/2002 | Hartmann | ................ | B26D 9/00 |
| | | | | 198/369.2 |
| 6,662,722 B2 * | 12/2003 | Frankenberger | ........ | B41F 25/00 |
| | | | | 101/231 |
| 7,428,959 B2 * | 9/2008 | Jung | ................... | B65G 49/063 |
| | | | | 198/493 |
| 7,857,121 B2 | 12/2010 | Yassour | | |
| 2002/0182047 A1 * | 12/2002 | Adam | ................... | B65G 51/03 |
| | | | | 414/676 |
| 2006/0054774 A1 * | 3/2006 | Yassour | ................ | B65G 51/03 |
| | | | | 248/631 |
| 2011/0135405 A1 * | 6/2011 | Miyaji | ................... | B65H 23/24 |
| | | | | 406/70 |
| 2015/0239682 A1 * | 8/2015 | Wang | ............... | H01L 21/67784 |
| | | | | 414/676 |

* cited by examiner

CONVEYING SYSTEM WITH VACUUM WHEEL

FIELD OF THE INVENTION

The present invention relates to conveying systems. More particularly, the present invention relates to a conveying system with a vacuum wheel.

BACKGROUND OF THE INVENTION

In the manufacture of large flat and thin objects, the objects often need to be conveyed from one location to another. For example, the objects may be transported from a workstation where a manufacturing process is performed, to another workstation where a different manufacturing process or inspection process is performed. In some such processes, it is necessary to restrict contact with the object to those regions of the object (e.g., typically margins that are adjacent to the edges) that are not intended to perform a critical function in the final product. Therefore, a contactless support surface may be utilized to support the object Examples of industries in which large thin and flat objects are produced include the manufacture of thin glass or polymer substrates for use in flat panel displays. Contact with such substrates during manufacture or inspection may be limited to regions, sometimes referred to as exclusion zones, that are located at the edges of the substrate. When incorporated into the final product (e.g., the display screen), the exclusion zones may serve a primarily mechanical function (e.g., holding the thin plate in place) rather than serving as a substrate for electronic components or connections or serving another function that requires contactless handling.

SUMMARY OF THE INVENTION

There is thus provided, in accordance with an embodiment of the present invention, a system for conveying a substrate, the system including: a noncontact support platform that is configured to support the substrate at a nonzero distance from a surface of the noncontact support platform; a vacuum wheel that is located adjacent to a part of the noncontact support platform, a peripheral rim of the vacuum wheel including a plurality of perforations that open between an exterior of the rim and an interior of the vacuum wheel; and a fixed suction surface that is interior to the vacuum wheel, the suction surface including an opening of a conduit, the conduit being connectable to a suction source, a chamber being formed by the suction surface, walls of the vacuum wheel, and a section of the peripheral rim that is adjacent to the suction surface and that extends outward from the surface of the noncontact support, wherein when suction is applied by the suction source to the conduit, the suction is applied via the chamber to the perforations in the section of the peripheral rim so as to exert a pull on the substrate toward the peripheral rim such that rotation of the vacuum wheel conveys the substrate.

Furthermore, in accordance with an embodiment of the present invention, the noncontact support platform is configured to generate bidirectional stiffness.

Furthermore, in accordance with an embodiment of the present invention, the noncontact support platform includes at least two parallel rails, and wherein the vacuum wheel is located in a gap between two of the at least two parallel rails.

Furthermore, in accordance with an embodiment of the present invention, the vacuum wheel is located in an opening of the noncontact support platform.

Furthermore, in accordance with an embodiment of the present invention, the vacuum wheel is located adjacent to an edge of the noncontact support platform.

Furthermore, in accordance with an embodiment of the present invention, the plurality of perforations are arranged in a plurality of parallel rows, the rows oriented at an oblique angle to an axle of the vacuum wheel.

Furthermore, in accordance with an embodiment of the present invention, the plurality of perforations are arranged such that when the applied suction is substantially constant, the exerted pull remains substantially constant as the vacuum wheel is rotated.

Furthermore, in accordance with an embodiment of the present invention, a total length of intersection of the plurality of perforations with any line that lies on the peripheral rim and is substantially parallel to an axle of the vacuum wheel is substantially constant.

Furthermore, in accordance with an embodiment of the present invention, each pair of azimuthally adjacent perforations of the plurality of perforations overlaps by a substantially constant azimuthal displacement.

Furthermore, in accordance with an embodiment of the present invention, the rim includes a nonslip material.

Furthermore, in accordance with an embodiment of the present invention, the suction surface is convexly curved in a tangential direction, a curvature of the suction surface being less than a curvature of the rim.

Furthermore, in accordance with an embodiment of the present invention, the system includes the suction source.

Furthermore, in accordance with an embodiment of the present invention, the suction source is further operable to apply pressure.

Furthermore, in accordance with an embodiment of the present invention, the system includes a controller that is configured to control the suction source to apply the suction or the pressure.

Furthermore, in accordance with an embodiment of the present invention, the controller is configured to control the suction source to apply the pressure when a leading edge of the substrate approaches the section of the wheel rim and to apply the suction when a surface of the substrate is at the section of the wheel rim.

Furthermore, in accordance with an embodiment of the present invention, the system includes one or a plurality of sensors to detect when the substrate is at the section of the wheel rim.

Furthermore, in accordance with an embodiment of the present invention, the one or a plurality of sensors includes a proximity sensor.

Furthermore, in accordance with an embodiment of the present invention, the controller is configured to control the suction source to apply the pressure when a trailing edge of the substrate is at the section of the wheel rim.

Furthermore, in accordance with an embodiment of the present invention, the system includes one or a plurality of sensors to detect when the trailing edge is at the section of the wheel rim.

Furthermore, in accordance with an embodiment of the present invention, the one or a plurality of sensors includes a pressure sensor.

BRIEF DESCRIPTION OF THE DRAWINGS

In order for the present invention, to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

Some embodiments of the invention may include an article such as a computer or processor readable medium, or a computer or processor non-transitory storage medium, such as for example a memory, a disk drive, or a USB flash memory, encoding, including or storing instructions, e.g., computer-executable instructions, which when executed by a processor or controller, carry out methods disclosed herein.

In accordance with an embodiment of the present invention, a conveying system is configured to convey a flat thin object, such as a thin glass or polymer substrate. Any such thin flat object for conveying by conveying system may be referred to herein, for convenience, as a substrate, regardless of the intended use of the object. The substrate conveying system is configured to mechanically contact the surface of the substrate only at predetermined regions herein referred to as exclusion zones. Typically, the exclusion zones are located at edges of the substrate. In some cases, an exclusion may be located elsewhere on the substrate surface (e.g., in a longitudinal band that is parallel to an intended direction of conveying of the substrate).

The substrate conveying system includes one or more noncontact support platforms. The noncontact support platform is configured to support a substrate at a nonzero distance from an exterior surface of the noncontact support platform. For example, the noncontact support platform may be configured to support the substrate on a cushion of air or another gas or fluid that is formed between the exterior platform surface and the substrate.

For example, the noncontact support platforms may include an array of pressure ports that are configured to expel pressurized air, or another gas. A plurality of vacuum ports (connected to a suction source) or exhaust ports (vented to the ambient atmosphere) may be interspersed among the pressure ports. As a result, the noncontact support platform may create bidirectional stiffness so as to hold the substrate at a substantially fixed distance from the noncontact support platform. A noncontact support platform that generates bidirectional stiffness may be configured to support the substrate from below (e.g., as would a standard air pressure table) or from above.

For example, the noncontact support platform of the substrate conveying system may include two or more parallel noncontact support rails separated from one another by parallel gaps. The longitudinal dimension of the noncontact rail surfaces may be substantially parallel to a direction along which substrates are to be conveyed. A substrate that the noncontact surface is configured to support and convey may be sufficiently wide to cover two or more of the noncontact rail surfaces. In this case, at least some of the gaps that separate the parallel noncontact support rails from one another may be situated so as to underlie an exclusion zone of a substrate that is being supported and conveyed by the noncontact support rails.

Alternatively or in addition, the noncontact support platform may include a single surface with one or more openings. The openings may be situated so as to underlie an exclusion zone of a substrate that is being supported and conveyed by the noncontact support platform.

The substrate conveying system includes one or more vacuum wheels that are adjacent to the noncontact support platform. Each vacuum wheel is configured to propel the substrate along a linear direction. The linear direction is substantially tangential to the rim of the vacuum wheel and substantially perpendicular to the axis of the vacuum wheel. As used herein, a vacuum wheel is considered to be adjacent to the noncontact support platform or to a part of the noncontact support platform, if the vacuum wheel is located within a gap between parallel noncontact support rails, within an opening in a noncontact support platform, or adjacent to an exterior lateral edge of the noncontact support platform. One side of the vacuum wheel extends outward from the surface of the noncontact support platform. (As used herein, outward from the surface of the noncontact support platform refers to a direction away from interior structure of the noncontact support platform and toward a supported substrate.). The vacuum wheel may be mounted such that when a substrate is supported by the noncontact support platform, the vacuum wheel is approximately tangent to the substrate.

Each vacuum wheel includes a wheel that is rotatable about its axis and a fixed vacuum assembly. The rim of the wheel includes an array of vacuum perforations that open from the interior of the rim to the exterior surface of the rim. As used herein, the rim of the wheel refers to the peripheral rim, that is, the surface of the wheel that is at the external perimeter of the wheel (e.g., the surface of the wheel that is configured to contact the substrate). Perforations refer to holes or openings that perforate the rim regardless of how the holes or openings are formed (e.g., whether by perforating a previously contiguous surface or a surface that was formed together with holes or openings). At least a part of the interior of the wheel that is adjacent to the wheel rim is hollow. A fixed vacuum assembly is configured to apply a vacuum (used herein interchangeably with the term "suction") to the vacuum perforations of a section of the perimeter rim that is currently at a predetermined orientation, herein referred to as active perforations. The section that includes the active perforations includes at least a section of the wheel rim that extends maximally (e.g., between 0.03 mm and 0.4 mm, or another nonzero distance) outward beyond a plane of the surface of the noncontact support platform. During rotation of the vacuum wheel, different sections of the rim are rotated to the position to which the vacuum is applied. The vacuum may be applied sequentially to the vacuum perforations in different sections along the perimeter of the rim to as the wheel is rotated about its axis. The active perforations to which the vacuum is applied may exert a pull on a surface of a substrate that covers those active perforations toward the rim of the wheel to contact the rim. The contact between the rim and the substrate may enable rotation of the wheel to convey the substrate in a direction tangential to the direction of rotation of the wheel.

For example, the vacuum wheel may be configured to contact a surface of the substrate that faces the noncontact support platform, e.g., through a gap or opening in the noncontact support platform. In this case, where the noncontact support platform is configured to support the substrate from below, the vacuum assembly may be configured to apply the vacuum to upward facing vacuum perforations in a section of the wheel rim that is currently at the top of the wheel. Where the noncontact support platform is configured to support the substrate from above, the vacuum assembly may be configured to apply the vacuum to the downward facing vacuum perforations in a section of the wheel rim that is currently at the bottom of the wheel. Alternatively or in addition, a vacuum wheel may be configured to contact a side of the substrate that is opposite the side that faces the noncontact support platform. In this case, where the noncontact support platform is configured to support the substrate from below, the vacuum assembly may be configured to apply the vacuum to downward facing vacuum perforations in a section of the wheel rim that is currently at the bottom of the wheel. Where the noncontact support platform is configured to support the substrate from above, the vacuum assembly may be configured to apply the vacuum to the upward facing vacuum perforations in a section of the wheel rim that is currently at the top of the wheel. Other configurations are possible.

The rim of the wheel surrounding or near the vacuum perforations may be provided with a nonslip surface. For example, a nonslip material on the rim may include a material that is characterized by a high coefficient of friction for motion relative to the substrate material. A nonslip material may include rubber or a rubber-like plastic, or another nonslip material. The nonslip surface may include texturing that is configured to increase traction between the rim and the substrate. The nonslip surface of the rim of the wheel may increase the traction between the vacuum wheel and a surface of a substrate that is being conveyed (e.g., increased over traction between a rim without a nonslip surface and the substrate surface). The increased traction may enable precise and efficient conveying, without slippage, of the substrate to a predetermined location.

The vacuum assembly includes a vacuum conduit opening in a fixed suction surface through which the vacuum is applied. The suction surface and conduit opening are located inside the wheel, adjacent to the inward-facing surface of the rim of the wheel. The suction surface and an adjacent section of the wheel rim form a vacuum chamber via which the vacuum is applied to the vacuum perforations (the active perforations) in the adjacent section. Lateral edges of the suction surface are located sufficiently close to the inward-facing surface of the rim (e.g., within 0.1 millimeter) so that sufficient vacuum (e.g., to enable the vacuum perforations to exert a pull on the substrate) is maintained within the vacuum chamber without impeding rotation of the wheel. For example, the suction surface may be arced with a curvature that is less than the curvature of the rim of the wheel. In this case, the vacuum chamber that is formed between the suction surface and the interior of the wheel may have a lune-like profile.

A suction source, such as a fan, blower, pump, compressor or other source of suction or vacuum may be connected to a vacuum inlet connector of the vacuum assembly. For example, the suction source may connect a hose that connects to the suction source may be connected to the vacuum inlet connector via a hose, pipe, tube, or other conduit. The conduit may be branched such that a single suction source may concurrently or otherwise apply a vacuum to the vacuum assemblies of a plurality of vacuum wheels of the substrate conveying system. In some cases, a branched conduit assembly may be provided with one or more controllable valves to enable selective application of vacuum to different vacuum wheels of the substrate conveying system.

The vacuum perforations on the rim of the wheel of the vacuum wheel may be arranged in a non-axially parallel pattern. As used herein, a non-axially parallel pattern of the vacuum perforations refers to a pattern in which sets of nearest neighboring vacuum perforations are not arranged in rows that are parallel to the wheel axis. Such a non-axially parallel pattern of the vacuum perforations may avoid a situation where vacuum wheel exerts a relatively large pull when an axially parallel row is in contact with the substrate, and a relatively smaller pull when a section of the rim between the rows is in contact with the substrate surface.

In particular, the vacuum perforations may be arranged in a staggered pattern. As used herein, a staggered pattern refers to an arrangement of the vacuum perforations in which the vacuum perforations are evenly distributed along an azimuth coordinate about the perimeter of the rim. In the staggered pattern, azimuthally adjacent (which could be widely separated in the axial direction, e.g., near opposite sides of the wheel) vacuum perforations overlap by a fixed amount. The azimuthal overlap between azimuthally adjacent vacuum perforations may enable the total area of vacuum perforations that is in contact with the substrate surface to be approximately constant. An approximately constant total area of vacuum perforations in contact with the substrate surface may result in an approximately constant pull that is exerted on the substrate. An approximately constant exerted pull may enable accurate positioning of the substrate.

A controller of the substrate conveying system may be configured to apply either pressure or suction to the vacuum assembly. For example, a suction source may include a reversible fan or blower. A direction of rotation or the fan or blower may be reversed in order to blow air or gas into the vacuum chamber and out the active perforations. As another example, separate suction and pressure sources may be connected to a conduit that connects to the vacuum assembly. A valve may be operated to selectively connect either the suction source or the pressure source to the conduit, and thus to the vacuum assembly.

A controller may be configured to control operation of one or more components of the substrate conveying system. For example, the controller may include a processing unit that is configured to operate in accordance with programmed instructions. Alternatively or in addition, the controller may include a circuit or circuitry that is configured to control the components.

For example, the controller may control operation of one or more of a motor for rotating the vacuum wheel, a transmission, a suction or pressure source, one or more valves for selectively connecting a suction or pressure source to one or more vacuum wheels, a noncontact support platform (application of pressure or vacuum), or another component of the substrate conveying system.

The controller may be configured to control application of one or more components of the substrate conveying system in accordance with one or more values of quantities that are sensed by one or more sensors. For example, the sensors may include one or more of a proximity sensor, a position sensor, a pressure sensor, a velocity sensor, or another type of sensor.

The controller may be configured to apply suction or pressure to the vacuum assembly of a vacuum wheel in accordance with whether the sensors indicate that the substrate is positioned at the vacuum wheel. For example, pressure may be applied as the substrate approaches the vacuum wheel. The pressure may provide a cushion of pressurized air to prevent the leading end of the substrate from violently impacting the rim of the vacuum wheel. Once the substrate is positioned at (e.g., above or below) the vacuum wheel, suction may be applied to the vacuum wheel to provide the required traction between the vacuum wheel and the substrate. When the trailing edge of the substrate leaves the vacuum wheel, pressure may again be applied to the vacuum wheel (e.g., to soften the separation of the trailing edge from the vacuum wheel, or in anticipation of arrival of the leading edge of another substrate).

For example, a proximity sensor that is located ahead (as determined by the direction of motion of the substrate) of the vacuum wheel may sense the approach of the leading edge of the substrate. At this point, pressure may be applied to the vacuum wheel. An additional proximity sensor that is located after the vacuum wheel may indicate that the leading edge has passed the vacuum wheel and that (e.g., when both proximity sensors sense the proximity of the substrate) the substrate and is now covering the vacuum wheel. At this point, suction may be applied to the vacuum wheel. A pressure sensor (e.g., a vacuum sensor) may indicate that the substrate is being held to the vacuum wheel by the suction. The pressure sensor may be placed anywhere between the suction source and the vacuum chamber. The pressure sensor may further indicate when the trailing edge of the substrate has reached the vacuum wheel (e.g., sensed as an increase in pressure as vacuum perforations on the rim of the wheel are fully or partially uncovered). At this point, pressure may be applied again to the vacuum wheel.

Figure 1A:
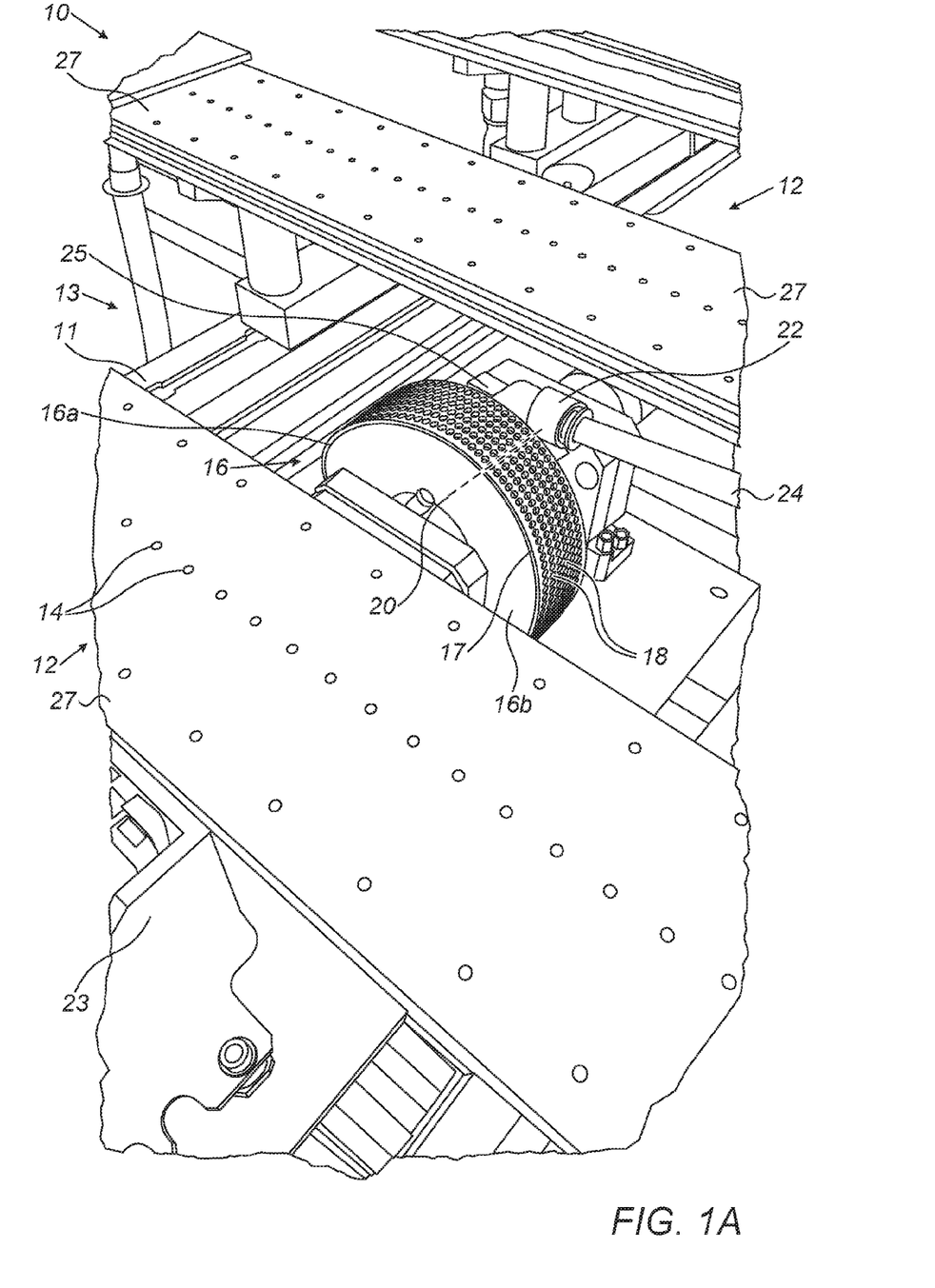
FIG. 1A shows a substrate conveying system, in accordance with an embodiment of the present invention.
Figure 1B:
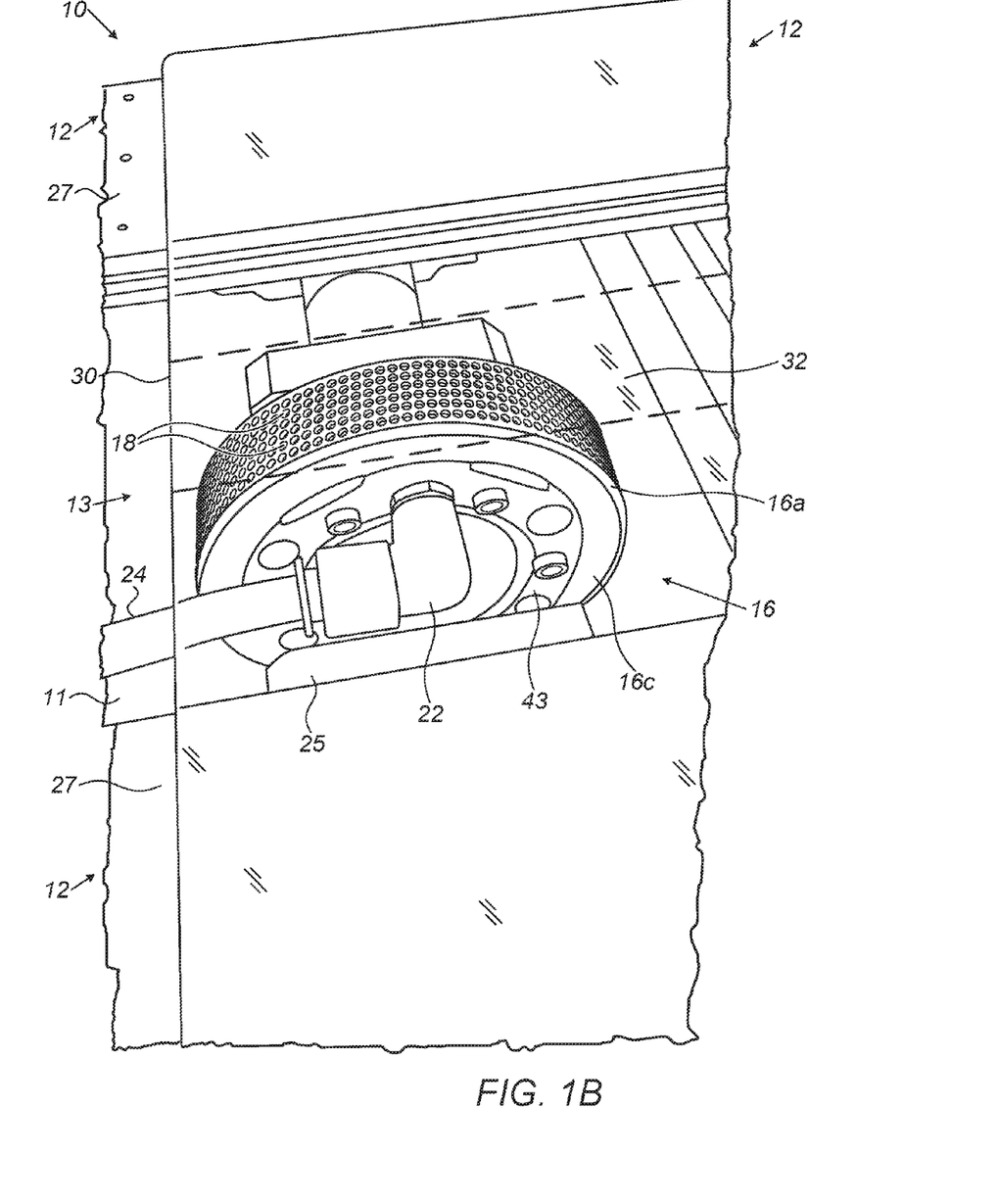
FIG. 1B shows another view of the substrate conveying system shown in FIG. 1A while conveying a substrate.
Figure 1C:
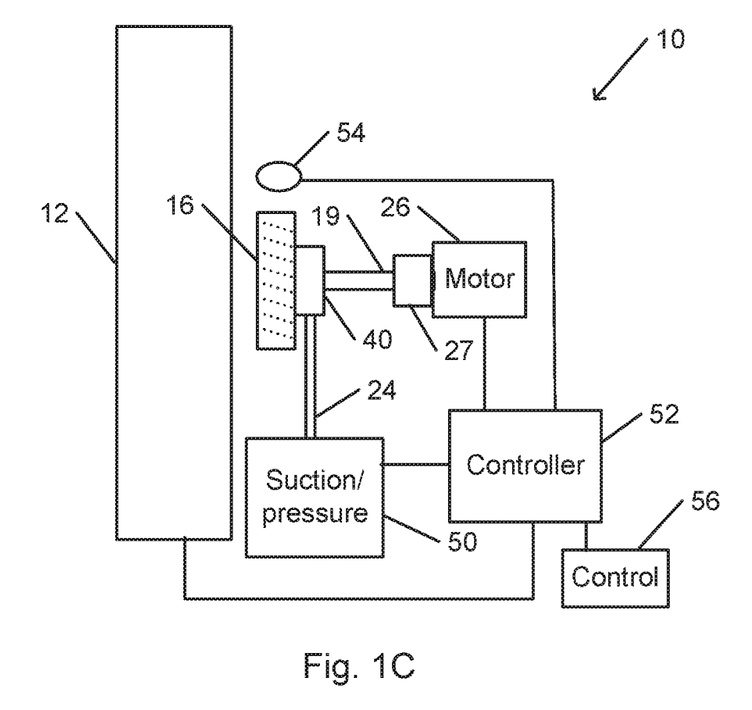
FIG. 1C is a schematic diagram of the substrate conveying system shown in FIG. 1A.

FIG. 1A shows a substrate conveying system, in accordance with an embodiment of the present invention. FIG. 1B shows another view of the substrate conveying system shown in FIG. 1A while conveying a substrate. FIG. 1C is a schematic diagram of the substrate conveying system shown in FIG. 1A.

Substrate conveying system 10 includes a system frame 11 to which various components of substrate conveying system 10 are mounted. System frame 11 may include a moveable table or a fixed fixture or structure. One or more of noncontact support platform 12, motor housing 23, wheel axle support 25, or other components of substrate conveying system 10 may be mounted to system frame 11.

Noncontact support platform 12, in the example shown in FIGS. 1A and 1B, includes a plurality of parallel support rails 27 separated by gap 13. Each support rail 27 of noncontact support platform 12 includes a plurality of ports 14. Other configurations of noncontact support platform 12, e.g., in the form of a single extended rectangular platform or other shape, may be used. Pressure or vacuum may be applied to each port 14 via a manifold of conduits that are incorporated within noncontact support platform 12.

Noncontact support platform 12 is configured to support a substrate 30 without mechanical contact between a solid component of noncontact support platform 12 and substrate 30. For example, substrate 30 may include a sheet of glass (e.g., for a flat panel display), or another flat, thin object. A size of noncontact support platform 12 may be configured (e.g., by its dimensions or by the number and size of parallel support rails 27 that are incorporated into noncontact support platform 12, or otherwise) to support a particular size and shape of substrate 30 (e.g., for a particular production line). In the case that noncontact support platform 12 is configured to provide bidirectional stiffness (via a fluidic spring effect), noncontact support platform 12 may be configured to support substrate 30 at a substantially fixed distance (e.g., between 0.03 mm and 0.4 mm) from the surface of noncontact support platform 12.

Vacuum wheel 16 is located in gap 13 between parallel support rails 27. The direction of rotation of vacuum wheel 16, perpendicular to wheel axle 19, is substantially parallel to the longitudinal dimension of parallel support rails 27 of noncontact support platform 12. Alternatively, vacuum wheel 16 may be located in an opening within (e.g., entirely or partly surrounded by) a single contiguous section of a noncontact support platform. Alternatively, vacuum wheel 16 may be located adjacent to an exterior edge of noncontact support platform 12 (e.g., when the exclusion zone is located at an edge of substrate 30 that extends beyond noncontact support platform 12).

Vacuum wheel 16 may be positioned relative to noncontact support platform 12 such that when a substrate 30 is supported by noncontact support platform 12, vacuum wheel 16 is positioned at an exclusion zone 32 of substrate 30. For example, exclusion zone 32 may include a region of substrate 30 that is not configured to incorporate or support electronic components or contacts in a product that incorporates substrate 30. Therefore, physical contact between vacuum wheel 16 and exclusion zone 32 may be permitted. The width of vacuum wheel 16 is limited to a width that is no wider than the width of exclusion zone 32.

Since types of substrate 30 may have differently sized and located exclusion zones 32, a vacuum wheel may be designed for a particular type of substrate 30. Noncontact support platform 12 may be custom designed for a particular substrate 30, or may be designed in manner (e.g., with modular components that may be assembled into a particular configuration for appropriately sized and positioned vacuum wheels 16, adjustable distances gaps between separate parallel support rails 27, or otherwise) to accommodate a particular substrate 30.

Wheel rim 16a of vacuum wheel 16 may be covered by nonslip cover 16. For example, nonslip cover 17 may include a coating or band of rubber or a similar high-friction natural or synthetic material. Alternatively or in addition, wheel rim 16a may be constructed of a nonslip material.

A vacuum chamber 41 (visible in FIGS. 3A and 3B) may be formed within vacuum wheel 16 by structure of vacuum assembly 40, and by a currently adjacent section of each of wheel rim 16a, full wall 16b, and partial wall 16c of vacuum wheel 16. The space that is surrounded by partial wall 16c may be filled by stationary plate 43 of vacuum assembly 40. Wheel rim 16a is perforated by an array of a plurality of vacuum perforations 18. At any time during rotation of vacuum wheel 16, some of vacuum perforations 18 (active perforations) connect vacuum chamber 41 to the ambient atmosphere outside of vacuum wheel 16.

Vacuum perforations 18 are arranged in a staggered pattern. The staggered pattern includes parallel rows 20 of vacuum perforations 18. Each of parallel rows 20 includes an identical number of vacuum perforations 18. Each row 20 of vacuum perforations 18 is oriented at an oblique angle to wheel axle 19 of vacuum wheel 16.

Suction or pressure may be applied to vacuum perforations 18 by operation of suction/pressure source device 50. Suction/pressure source device 50 may be connected to vacuum assembly 40 via conduit 24 and vacuum assembly connector 22.

For example, suction/pressure source device 50 may include a fan, turbine, or another component of a blower that is reversible. When operated in one direction, the blower of suction/pressure source device 50 may apply suction to vacuum chamber 41 and the adjacent vacuum perforations 18 while venting the sucked air to the ambient atmosphere. When operated in the reverse direction, the blower of suction/pressure source device 50 may suck air from the ambient atmosphere and force the pressurized air into vacuum chamber 41.

Alternatively or in addition, suction/pressure source device 50 may include separate suction or pressure sources. The separate vacuum and pressure sources may operate continuously. Suction/pressure source device 50 (or conduit 24) may include a valve that selectively connects either the suction source or the pressure source to conduit 24 or to vacuum assembly 40.

In some cases, suction/pressure source device 50 may include a suction source only.

Operation of suction/pressure source device 50 may be controlled by system controller 52. For example, controller 52 may control a direction of rotation of a fan or turbine of a blower of suction/pressure source device 50. Controller 52 may control a speed of rotation of a fan or turbine of a blower of suction/pressure source device 50.

For example, controller 52 may include one or more programmable data processing units or computers that may operate in accordance with programmed instructions. Alternatively or in addition, controller 52 may include analog or digital circuitry that is configured to operate one or more devices or units of substrate conveying system 10 in response to operation of one or more user-operable controls 56, or in response to one or more sensed conditions.

User-operable controls 56 may include one or more switches, levers, touch screens, pushbuttons, keys, knobs, or other controls that may be operated by a user. For example, a user may operate user-operable controls 56 to indicate starting or stopping operation of substrate conveying system 10, a direction (e.g., forward or reverse) of conveying, a speed of conveying, a type of substrate 30 that is to be conveyed, a characteristic of a substrate 30 that is to be conveyed (e.g., size, weight, density, thickness, or other characteristic), a mode of operation, or another user input indication.

Controller 52 may receive signals from one or more sensors 54. For example, one or more of sensors 54 may be configured to sense a quantity that is indicative of a location of a substrate 30 relative to vacuum wheel 16. Such sensors may include, for example, a proximity sensor (e.g., optical, electromagnetic, acoustic, or mechanical proximity sensor), a pressure sensor (e.g., that is configured to sense an air pressure in vacuum chamber 41, vacuum assembly 40, conduit 24, or elsewhere), a motion sensor, a location sensor (e.g., optical), or another type of sensor that is configured to sense a quantity that is indicative of a position of a substrate 30.

Controller 52 may be configured to control operation of suction/pressure source device 50 in accordance with a quantity that is sensed by sensors 54. For example, controller 52 may control suction/pressure source device 50 to provide pressure to vacuum perforations 18 of vacuum wheel 16 when a signal from one or more sensors 54 is indicative of that a leading edge of substrate 30 is approaching vacuum wheel 16. Controller 52 may control suction/pressure source device 50 to provide suction to vacuum perforations 18 of vacuum wheel 16 when a signal from one or more sensors 54 is indicative of the leading edge of substrate 30 having crossed vacuum wheel 16 (such that the surface of substrate 30 is opposite vacuum wheel 16). Similarly, controller 52 may control suction/pressure source device 50 to provide pressure to vacuum perforations 18 of vacuum wheel 16 when a signal from one or more sensors 54 is indicative of that a trailing edge of substrate 30 is about to leave vacuum wheel 16. Such control may soften or eliminate mechanical shock to substrate 30 when establishing or breaking contact with vacuum wheel 16.

Motor housing 23 is configured to house motor 26. Motor 26 is configured to apply a torque to wheel axle 19 of vacuum wheel 16. Motor 26 may include a one or more motors.

Motor housing 23 may house transmission 27. Torque may be transmitted from motor 26 to wheel axle 19 via transmission 27. For example, transmission 27 may include a direct connection of a shaft of motor 26 to wheel axle 19, or may include one or more gears. Transmission 27 may be adjustable, e.g., with an adjustable gear ratio.

Operation of motor 26 or transmission 27, or both, may be controlled by controller 52. For example, controller 52 may be configured to operate motor 26, or to engage transmission 27, when sensors 54 indicate that a substrate 30 is near or in contact with vacuum wheel 16. Alternatively or in addition, controller 52 may be configured to operate motor 26 continuously when power is supplied to substrate conveying system 10.

Figure 2:
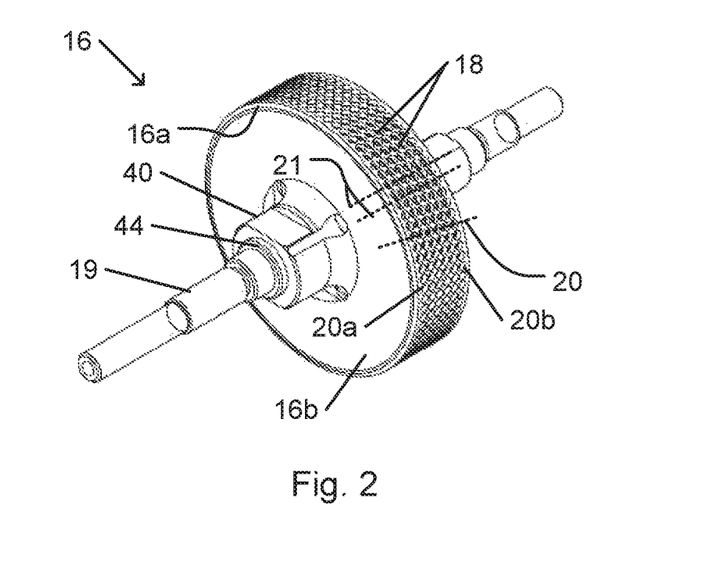
FIG. 2 schematically illustrates a vacuum wheel for a substrate conveying system, in accordance with an embodiment of the present invention.

FIG. 2 schematically illustrates a vacuum wheel for a substrate conveying system, in accordance with an embodiment of the present invention.

Vacuum assembly 40 is configured to be held in a fixed position and orientation relative to system frame 11. Vacuum wheel 16, including wheel rim 16a, full wall 16b, and partial wall 16c are rotatable together with wheel axle 19. Bearing 44 enables wheel axle 19 to rotate freely relative to vacuum assembly 40.

Vacuum perforations 18 are arranged on wheel rim 16a such that when a suction force that is applied by suction/pressure source device 50 is constant, vacuum perforations 18 exert a substantially constant pull on substrate 30.

For example, vacuum perforations 18 may be arranged on wheel rim 16a in a staggered arrangement in parallel rows 20 that are each oriented at an oblique angle to wheel axle 19. An orientation of and spacing between parallel rows 20 may be selected, taking into consideration the size of vacuum perforations 18, to enable an approximately uniform and constant suction force on a substrate 30. For example, the total length of intersection of an axial rim line 21 (a line on the surface of wheel rim 16a that is oriented parallel to wheel axle 19) with vacuum perforations 18 may be considered. When the staggered arrangement of vacuum perforations 18 is such as to create a substantially uniform and constant suction force, the total length of intersection with vacuum perforations 18 of any axial rim line 21 may be substantially equal to the total length of intersection with any other axial rim line 21.

Vacuum perforations 18 may be arranged such that each pair of azimuthally adjacent vacuum perforations 18 are displaced from one another (or, equivalently, overlap) in the azimuthal direction by a substantially equal distance. As used herein, two vacuum perforations 18 are referred to as azimuthally adjacent when progressing along the wheel rim 16a, one vacuum perforation 18 of the pair is encountered immediately after encountering the other vacuum perforation 18 without first encountering another vacuum perforation 18 (e.g., whether the vacuum perforations 18 of the pair are adjacent to one another within a single row 20, or include a vacuum perforation 18 at one end 20a of one row 20 and a vacuum perforation 18 at an opposite end 20b of another row 20). Equivalently, when all vacuum perforations 18 are projected onto a single plane that is perpendicular to wheel axle 19, two vacuum perforations 18 are azimuthally adjacent when they are adjacent within the projection.

Figure 3A:
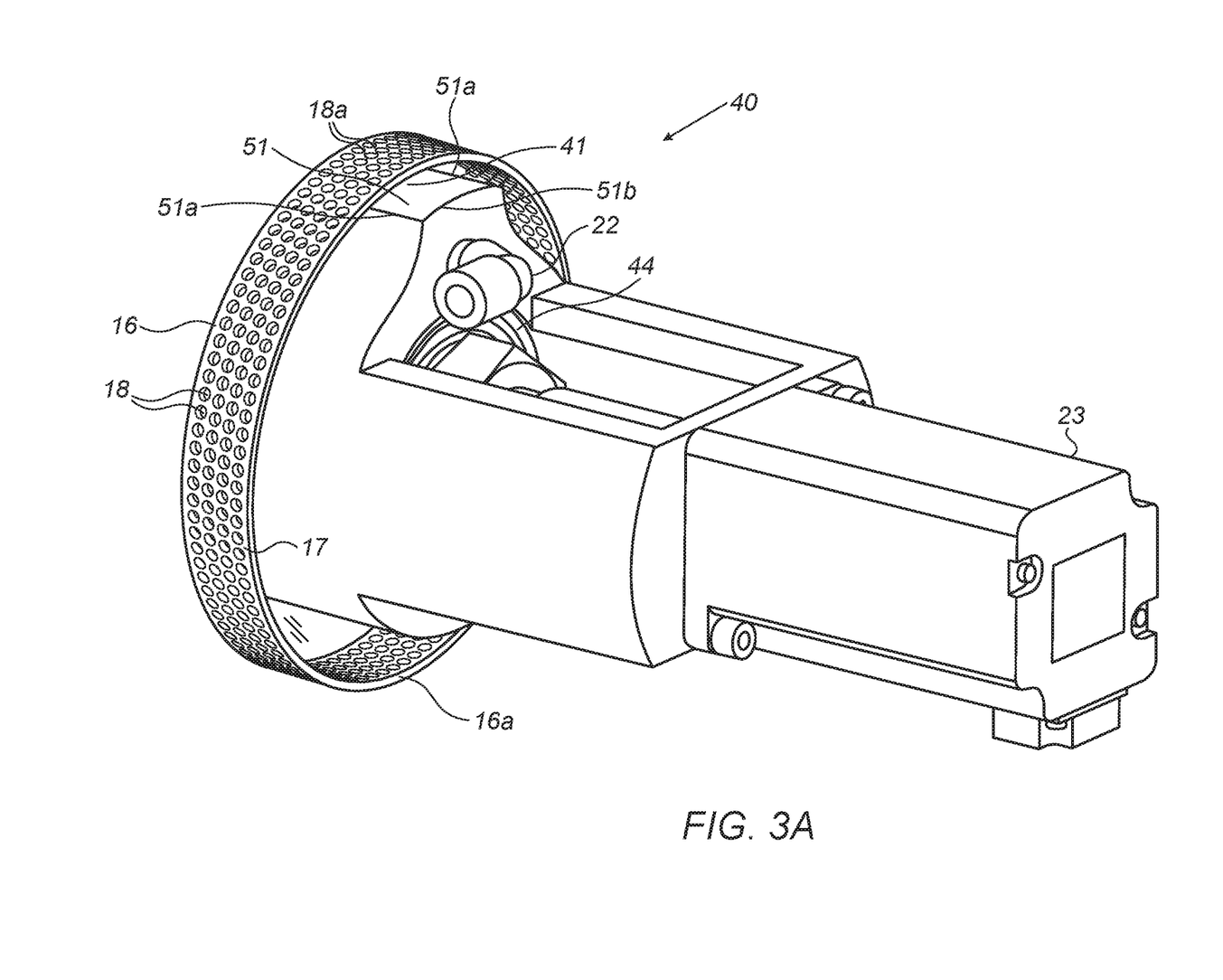
FIG. 3A schematically illustrates structure of a vacuum wheel for a substrate conveying system, in accordance with an embodiment of the present invention.
Figure 3B:
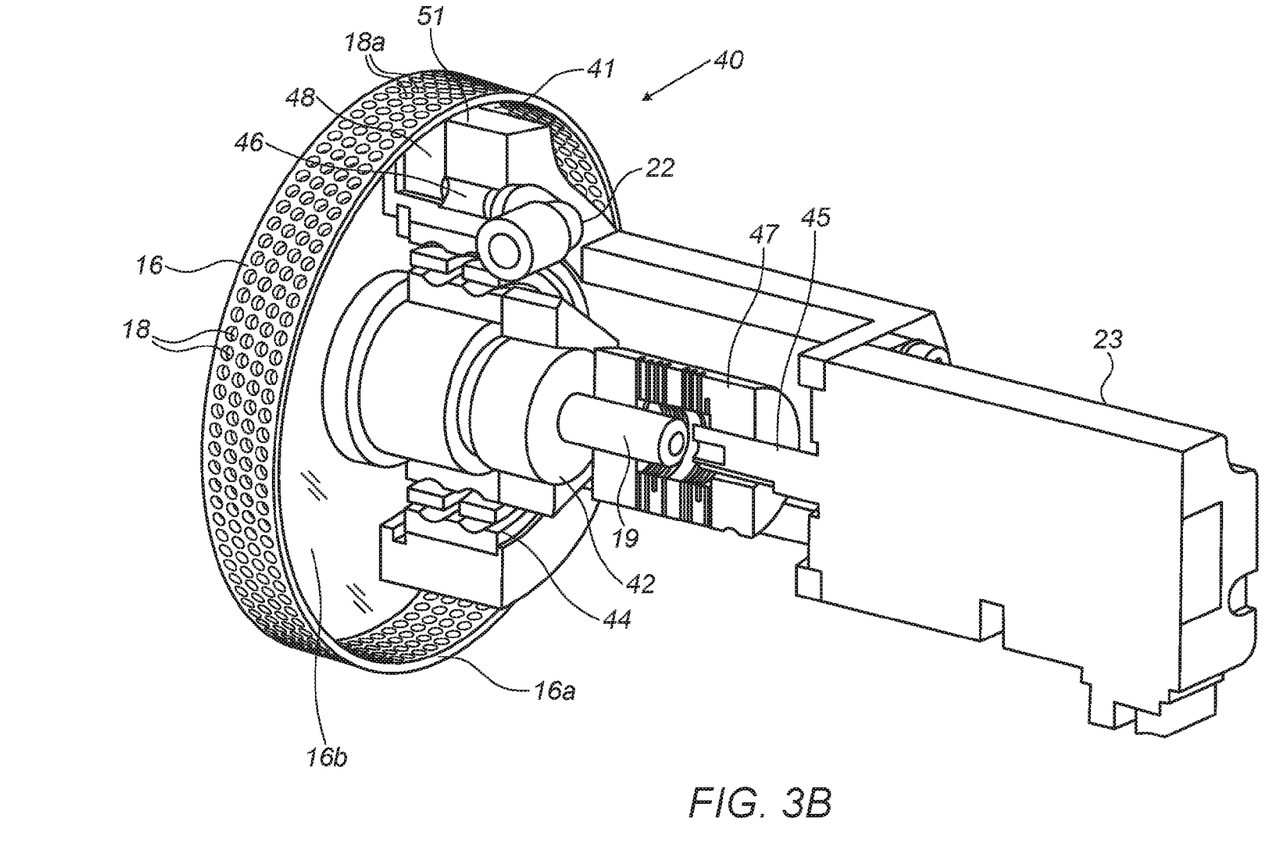
FIG. 3B schematically illustrates internal structure of a vacuum assembly of the vacuum wheel shown in FIG. 3A.

FIG. 3A schematically illustrates structure of a vacuum wheel for a substrate conveying system, in accordance with an embodiment of the present invention. FIG. 3B schematically illustrates internal structure of a vacuum assembly of the vacuum wheel shown in FIG. 3A.

Motor shaft 45 is rotatable by motor 26. Motor shaft 45 is coupled to wheel axle 19 such that rotation of motor shaft 45 may rotate wheel axle 19 and vacuum wheel 16. For example, the coupling between motor shaft 45 and wheel axle 19 may include flexible coupling 47. Flexible coupling 47 may tolerate or enable limited movement or misalignment between motor shaft 45 and wheel axle 19, while continuing to transmit torque. The tolerance to limited movement or misalignment may reduce stress that could otherwise result.

Wheel axle 19 connects to full wall 16b of vacuum wheel 16 at hub structure 42. The interior of vacuum wheel 16 between full wall 16b, wheel rim 16a, and hub structure 42 is hollow. Active components of vacuum assembly 40 are configured to fit in the hollow space.

Vacuum assembly connector 22 connects suction/pressure source device 50 (via conduit 24) via internal conduit 46 to vacuum assembly conduit opening 48. Vacuum assembly conduit opening 48 opens under active perforations 18a in suction surface 51. Suction surface 51 extends laterally in the tangential direction of wheel rim 16a with a convex curvature that is less than the curvature of wheel rim 16a to close to the interior surface of wheel rim 16a. Alternatively, the suction surface may be substantially flat or have a concave curvature.

Suction surface 51 and wheel rim 16a form vacuum chamber 41. Since suction surface 51 has convex curvature, the profile of vacuum chamber 41 is lune shaped. (The shape of vacuum chamber 41 would be different for a flat or concave suction surface.) Tangential edges 51a of suction surface 51 approach the inner surface of wheel rim 16a sufficiently closely such that inflow or outflow of air in the gap between tangential edges 51a and wheel rim 16a is impeded. Similarly axial edges 51b of suction surface 51 approach the inner surface of full wall 16b and partial wall 16c sufficiently closely such that inflow or outflow of air in the gap between axial edge 51b and either full wall 16b or partial wall 16c is impeded. In some cases, tangential edge 51a or axial edge 51b may be provided with a partially sealing structure (e.g., a felt pad, soft brush bristles, or similar structure) that further impedes air flow through the gap without significantly impeding or interfering with rotation of vacuum wheel 16.

Thus, when suction is applied to vacuum assembly conduit opening 48, a partial vacuum may form within vacuum chamber 41. The suction may thus be applied to active perforations 18a that open between vacuum chamber 41 and the ambient atmosphere. Thus, the suction may hold an adjacent substrate 30 to the surface of wheel rim 16a. Similarly, when pressurized air is forced into vacuum assembly conduit opening 48, air in vacuum chamber 41 may become pressurized. The pressure may thus be applied to active perforations 18a that open between vacuum chamber 41 and the ambient atmosphere. Thus, the pressure may push a surface of an adjacent substrate (e.g., a surface at a leading or trailing edge of substrate 30) away from the surface of wheel rim 16a.

In accordance with an embodiment of the present invention, controller 52 of substrate conveying system 10 may be configured to control components of substrate conveying system 10 in accordance with a conveying system control method.

Figure 4:
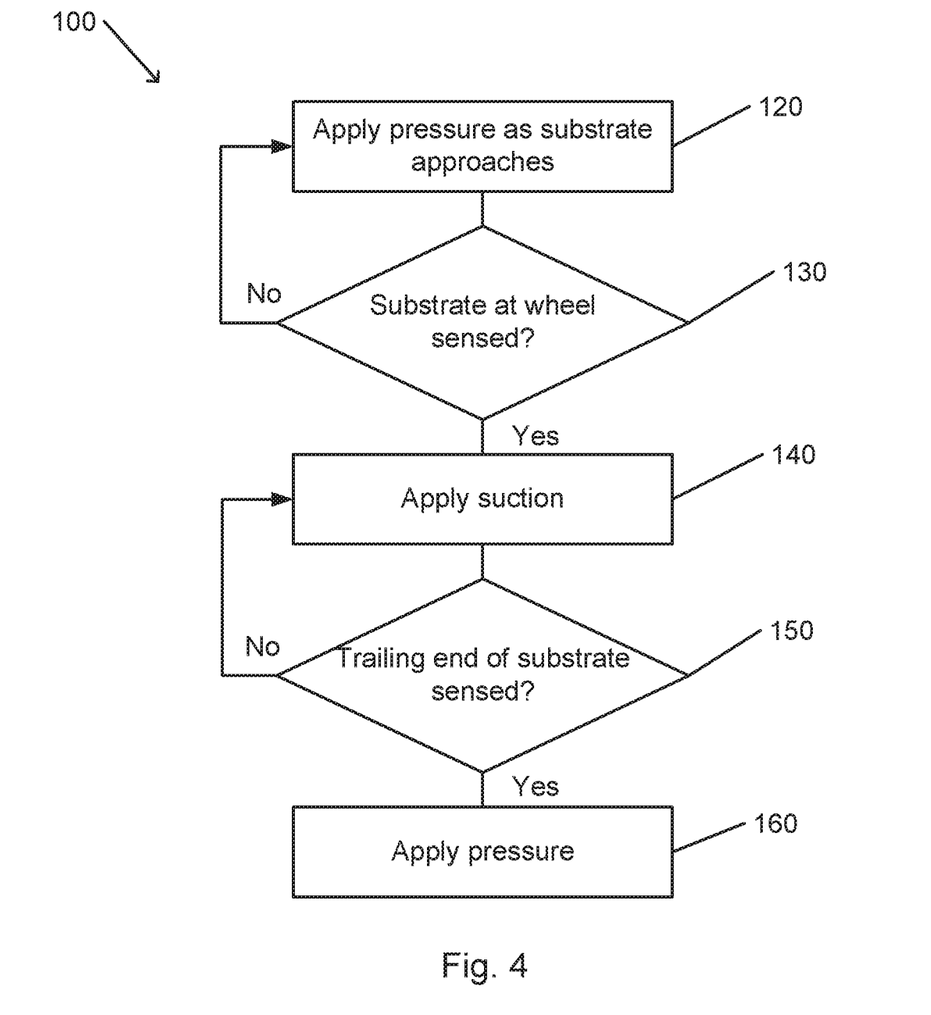
FIG. 4 is a flowchart depicting a method for controlling operation of a substrate conveying system, in accordance with an embodiment of the present invention.

FIG. 4 is a flowchart depicting a method for controlling operation of a substrate conveying system, in accordance with an embodiment of the present invention.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Conveying system control method 100 may be executed by a controller 52 of a substrate conveying system 10. Conveying system control method 100 may be executed continuously during operation of substrate conveying system 10, or may be executed in response to an action by an operator of substrate conveying system 10, or in response to a sensed event.

As a leading edge of a substrate 30 approaches vacuum wheel 16, controller 52 may operate suction/pressure source device 50 to apply pressure to active perforations 18*a* of vacuum wheel 16 (block 120). For example, a default mode of operation of substrate conveying system 10 may include operating suction/pressure source device 50 to provide pressure. Alternatively or in addition, controller 52 may be configured to operate suction/pressure source device 50 to provide pressure when a sensor 52, such as a position sensor or a proximity sensor, indicates the approach of the leading edge of substrate 30. In this case, until the approach is indicated, suction/pressure source device 50 may be configured to apply neither pressure nor suction to active perforations 18*a*, or may be configured to apply a lower pressure or suction to active perforations 18*a*.

Application of pressure to vacuum wheel 16 may continue until sensors 52 indicate that the surface of substrate 30 is at (e.g., covers or is opposite) vacuum wheel 16 (block 130). For example, a proximity or position sensor may indicate that the leading edge has passed at least part of vacuum wheel 16. An optical or acoustic position sensor may sense that substrate 30 is at (e.g., blocks a straight line path at or near) vacuum wheel 16. A pressure sensor may indicate that substrate 30 is affecting air flow out of active perforations 18*a*.

When it is sensed that substrate 30 is at vacuum wheel 16, controller 52 may control suction/pressure source device 50 to a apply suction to active perforations 18*a* of vacuum wheel 16 (block 140).

Application of the suction may continue until it is sensed that a trailing edge of substrate 30 has reached vacuum wheel 16 (block 150). For example, a pressure sensor may indicate that suction is being reduced by partial uncovering of active perforations 18*a* by the trailing edge of substrate 30. A proximity or position sensor may indicate that the trailing edge is at vacuum wheel 16.

When the trailing edge of substrate 30 is sensed to be at vacuum wheel 16, controller 52 may operate suction/pressure source device 50 to provide pressure to active perforations 18*a* of vacuum wheel 16 (block 160).

Application of the pressure may continue until the trailing edge is sensed to have completely left vacuum. In some cases, application of pressure may be a default condition that continues until the substrate is sensed to be at the vacuum wheel (e.g., as in the operation of block 130). In some cases, neither pressure nor suction is applied to vacuum wheel 16 until the approach of a substrate 30 is sensed. In some cases, suction may be applied as a default condition.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A system for conveying a substrate, the system comprising:
   a noncontact support platform that is configured to support the substrate at a nonzero distance from a surface of the noncontact support platform;
   a vacuum wheel that is located adjacent to a part of the noncontact support platform, a peripheral rim of the vacuum wheel including a plurality of perforations that open between an exterior of the rim and an interior of the vacuum wheel, said plurality of perforations being arranged in a pluarlity of parallel rows, the rows oriented at an oblique angle to an axle of the vacuum wheel;
   a suction source that is further operable to apply pressure; and
   a fixed suction surface that is interior to the vacuum wheel, the suction surface including an opening of a conduit, the conduit connected to the suction source, a chamber being formed by the suction surface, walls of the vacuum wheel, and a section of the peripheral rim that is adjacent to the suction surface and that extends outward from the surface of the noncontact support,
   wherein, when suction is applied by the suction source to the conduit, the suction is applied via the chamber to the perforations in said section of the peripheral rim so as to exert a pull on the substrate toward the peripheral rim such that rotation of the vacuum wheel conveys the substrate.

2. The system of claim 1, wherein the noncontact support platform is configured to generate bidirectional stiffness.

3. The system of claim 1, wherein the noncontact support platform comprises at least two parallel rails, and wherein the vacuum wheel is located in a gap between two of said at least two parallel rails.

4. The system of claim 1, wherein the vacuum wheel is located in an opening of the noncontact support platform.

5. The system of claim 1, wherein the vacuum wheel is located adjacent to an edge of the noncontact support platform.

6. A system, for conveying a substrate, the system comprising:
   a noncontact support platform that is configured to support the substrate at a nonzero distance from a surface of the noncontact support platform;
   a vacuum wheel that is located adjacent to a part of the noncontact support platform, a peripheral rim of the vacuum wheel including a plurality of perforations that open between an exterior of the rim and an interior of the vacuum wheel, said plurality of perforations being arranged such that, when the applied suction is substantially constant, the exerted pull remains substantially constant as the vacuum wheel is rotated;
   a suction source that is further operable to apply pressure; and
   a fixed suction surface that is interior to the vacuum wheel, the suction surface including an opening of a conduit, the conduit connected to the suction source, a chamber being formed by the suction surface, walls of the vacuum wheel, and a section of the peripheral rim that is adjacent to the suction surface and that extends outward from the surface of the noncontact support, wherein, when suction is applied by the suction source to the conduit, the suction is applied via the chamber to the perforations in said section of the peripheral rim so as to exert a pull on the substrate toward the peripheral rim such that rotation of the vacuum wheel conveys the substrate.

7. The system of claim 6, wherein a total length of intersection of said plurality of perforations with any line that lies on the peripheral rim and is substantially parallel to an axle of the vacuum wheel is substantially constant.

8. The system of claim 6, wherein each pair of azimuthally adjacent perforations of said plurality of perforations overlap by a substantially constant azimuthal displacement.

9. The system of claim 1, wherein the rim includes a nonslip material.

10. A system for conveying a substrate, the system comprising:
   a noncontact support platform that is configured to support the substrate at a nonzero distance from a surface of the noncontact support platform;
   a vacuum wheel that is located adjacent to a part of the noncontact support platform, a peripheral rim of the vacuum wheel including a plurality of perforations that open between an exterior of the rim and an interior of the vacuum wheel; and
   a fixed suction surface that is interior to the vacuum wheel, the suction surface including an opening of a conduit, the conduit being configured for connection to a suction source, a chamber being formed by the suction surface, walls of the vacuum wheel, and a section of the peripheral rim that is adjacent to the suction surface and that extends outward from the surface of the noncontact support, the suction surface being convexly curved in a tangential direction, a curvature of the suction surface being less than a curvature of the rim, wherein, when suction is applied by the suction source to the conduit, the suction is applied via the chamber to the perforations in said section of the peripheral rim so as to exert a pull on the substrate toward the peripheral rim such that rotation of the vacuum wheel conveys the substrate.

11. The system of claim 1, further comprising a controller that is configured to control the suction source to apply the suction or the pressure.

12. The system of claim 11, wherein the controller is configured to control the suction source to apply the pressure when a leading edge of the substrate approaches said section of the wheel rim and to apply the suction when a surface of the substrate is at said section of the wheel rim.

13. The system of claim 12, further comprising one or a plurality of sensors to detect when the substrate is at said section of the wheel rim.

14. The system of claim 13, wherein said one or a plurality of sensors comprises a proximity sensor.

15. The system of claim 11, wherein the controller is configured to control the suction source to apply the pressure when a trailing edge of the substrate is at said section of the wheel rim.

16. The system of claim 15, further comprising one or a plurality of sensors to detect when the trailing edge is at said section of the wheel rim.

17. The system of claim 16, wherein said one or a plurality of sensors comprises a pressure sensor.

* * * * *